United States Patent [19]

Buckner et al.

[11] Patent Number: 5,712,613

[45] Date of Patent: Jan. 27, 1998

[54] COMPUTER-AIDED METHOD FOR PRODUCING RESISTIVE TAPERS AND RESISTIVE TAPER PRODUCED THEREBY

[75] Inventors: Stephen C. Buckner, St. Ann., Mo.; Thaddeus J. Podgajny, Edwardsville; Matthew M. Thomas, Madison, both of Ill.

[73] Assignee: McDonnell Douglas Corporation, St. Louis, Mo.

[21] Appl. No.: 435,710

[22] Filed: May 5, 1995

[51] Int. Cl.$^6$ ............................................. A01C 1/012
[52] U.S. Cl. ................... 338/217; 29/610.1; 29/620; 328/307; 216/16
[58] Field of Search ........................... 29/610.1, 620; 338/89, 217, 218, 283, 307, 308, 309; 148/DIG. 106, DIG. 136; 216/16; 156/640.1

[56] References Cited

U.S. PATENT DOCUMENTS

| | | | |
|---|---|---|---|
| 2,061,107 | 11/1936 | Schellenger | 91/68 |
| 3,240,602 | 3/1966 | Johnston | 338/307 |
| 3,266,005 | 8/1966 | Balde et al. | 338/308 |
| 3,564,475 | 2/1971 | Tatsuo | 338/89 |
| 3,601,590 | 8/1971 | Norton et al. | 395/365 |
| 3,645,734 | 2/1972 | Noguchi | 96/36.1 |
| 3,649,394 | 3/1972 | Erickson, Jr. | 156/640.1 |
| 4,099,071 | 7/1978 | Thornburg | 327/365 |
| 4,436,806 | 3/1984 | Rendulic et al. | 430/311 |
| 4,666,818 | 5/1987 | Lake et al. | 430/256 |
| 4,686,629 | 8/1987 | Noto et al. | 364/491 |
| 4,820,928 | 4/1989 | Ooyama et al. | 250/492.2 |
| 4,878,770 | 11/1989 | Ruggiero et al. | 338/307 |
| 4,888,089 | 12/1989 | Marstiller et al. | 216/16 |
| 4,952,459 | 8/1990 | Thatcher | 428/426 |
| 4,999,277 | 3/1991 | Haddock et al. | 430/269 |
| 5,010,322 | 4/1991 | Fry et al. | 340/700 |
| 5,134,423 | 7/1992 | Haupt | 343/912 |
| 5,153,084 | 10/1992 | Foust et al. | 395/921 |
| 5,161,114 | 11/1992 | Akiyama | 364/490 |
| 5,242,770 | 9/1993 | Chen et al. | 395/921 |
| 5,311,199 | 5/1994 | Fraschilla et al. | 343/767 |
| 5,344,729 | 9/1994 | Akins et al. | 430/5 |
| 5,494,180 | 2/1996 | Callahan | 29/610.1 |

OTHER PUBLICATIONS

Thick Film Sensors, "Thick Film Sensors", chpt. by White, book ed. by Prudenziati, pp. 3–5, (1994).

*Primary Examiner*—Geoffrey S. Evans
*Assistant Examiner*—Karl Easthom
*Attorney, Agent, or Firm*—Bryan Cave LLP

[57] ABSTRACT

A method for producing a desired resistive taper under computer control for controlling the surface resistivity of an electrical element, which comprises the steps of creating a computer controlled optically graded pattern corresponding to the desired resistive taper, producing a phototool from the graded pattern and using the phototool to photochemically etch the graded pattern onto a substrate.

11 Claims, 2 Drawing Sheets

FIG. 1

CREATE A COMPUTER-CONTROLLED OPTICALLY GRADED PATTERN CORRESPONDING TO THE DESIRED RESISTIVE TAPER

PRODUCE A PHOTOTOOL FROM THE COMPUTER-CONTROLLED OPTICALLY GRADED PATTERN

PHOTOCHEMICALLY ETCH THE COMPUTER-CONTROLLED OPTICALLY GRADED PATTERN ONTO A SUBSTRATE USING THE PHOTOTOOL

10

COMPUTER-AIDED METHOD FOR PRODUCING RESISTIVE TAPERS AND RESISTIVE TAPER PRODUCED THEREBY

BACKGROUND OF THE INVENTION

1. Field Of The Invention

The present invention relates to electrical resistance devices and more particularly to a method for producing electrical resistance devices for controlling surface resistivity wherein the resistance of the device tapers along at least one dimension of the device.

2. Description of the Prior Art

An electrical resistance device consists of a thin layer of conductive material, for example, nickel or silver, carried on an insulating material such as silicon or organic plastic. Resistive tapers are devices whose surface resistivity varies along the taper. The resistivity of such a device can be tapered across one or more dimensions of the device by varying the pattern of the metallic coating deposited on the insulating substrate. When the metallic coating is applied, the device will have a low resistivity in areas where the metallic coating is dense, and a high resistivity in areas where the metallic coating is sparse. By uniformly tapering the metallic coating across the substrate, the surface resistivity of the device can be controlled.

Resistive tapers are useful in all applications that require the controlled dissipation of surface currents including electronics, communication equipment, satellites and antennas. The resistivity of tapers are traditionally based on linear, exponential, or other mathematical functions such as hyperbolic cosine.

Traditionally, resistive tapers are produced by blending materials of different resistivities and spraying the blended mixture onto a surface to produce the resistive taper. This traditional production method suffers from several deficiencies. For example, this method assumes that the individual materials which are blended are homogeneous and, therefore, the resistivity of the resultant resistive taper can be computed using a linear mixing rule. However, experience in the prior art has demonstrated that this assumption is not always accurate.

In addition, the quality of the resistive taper produced by employing the traditional spraying method depends greatly upon the individual technician who performs the spraying. If the technician is highly skilled, the quality of the resistive taper will be primarily limited by the materials which are blended together. However, if the technician is less skilled, the quality of the resistive taper will be diminished accordingly. Additionally, fatigue suffered by the technician can result in reduced taper quality.

Furthermore, the process of spraying the blended materials does not allow for adequate control over the grade of resistivity across the taper. In applications which employ resistive tapers, it is often desired, for example, that the resistivity of the taper vary according to a particular mathematical function such as the hyperbolic cosine of the distance in the direction of the taper. A true hyperbolic cosine grade in the resistive taper is difficult to achieve using the traditional method of spraying. In such applications, one must usually settle for a very coarse approximation of the desired grade.

Moreover, the process of spraying to produce resistive tapers does not work well for tapers whose shapes are non-rectangular such as ellipses, circles, trapezoids or any shape designed to fit into a sharp corner. Additionally, it is almost impossible to spray a taper whose resistivity is graded along a radial, as opposed to a linear, dimension. The traditional spraying methods are incapable of producing such detailed, unconventional tapers and any modifications to the conventional spraying techniques in order to produce these desired tapers would increase the cost of the taper.

Thus, various problems and disadvantages exist with prior art methods for producing resistive tapers which are overcome by the present invention.

SUMMARY OF THE INVENTION

In accordance with the presently preferred method of the present invention a computer-controlled optically graded pattern corresponding to the desired resistive taper is created, a phototool from the computer-controlled optically graded pattern is produced and then the graded pattern is photochemically etched onto a substrate, preferably an insulating substrate covered by a thin conductive coating. This results in resistive tapers whose grades of resistivity are well defined and controlled. Additionally, resistive tapers, created using the preferred method of the present invention can be fabricated into a wide variety of shapes and sizes.

BRIEF DESCRIPTION OF THE DRAWING

These and other features, aspects and advantages of the present invention will become better understood with regard to the following description, appended claims, and accompanying drawing where:

FIG. 1 is a stepwise diagram illustrating the presently preferred computer-aided resistive taper generating method of the present invention.

DETAILED DESCRIPTION OF THE PREFERRED EMBODIMENT

Figure 2:
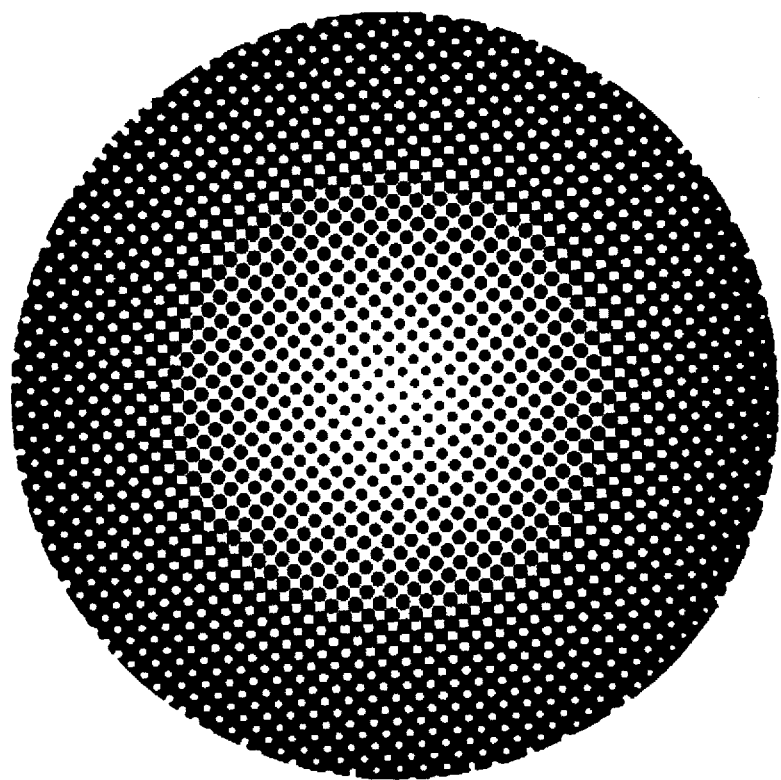
FIG. 2 is an optically graded pattern created under computer control used in the method of the present invention and represents the pattern of the resulting phototool, and the resistivity of the resultant resistive taper.

The presently preferred method of the present invention provides a method for producing resistive tapers under computer control for controlling the surface resistivity of an electrical device which preferably comprises the steps of creating a computer controlled optically graded pattern corresponding to the desired resistive taper, producing a phototool from the computer controlled optically graded pattern and then using the phototool to photochemically etch the graded pattern onto a substrate. By way of example, the principal steps of the presently preferred method of the present invention are illustrated in FIG. 1.

As shown in FIG. 1, a conventional computer is used to create a representation of the graded pattern of metal to be applied to the insulating substrate. As illustrated in FIG. 2, the graded pattern 10, preferably corresponds to the desired resistive taper, the resistivity of the resultant resistive taper preferably varies with the optical density of the pattern, and the optical pattern must preferably be tailored for each combination of insulating material and conductive coating used. The pattern can preferably be graded according to a linear or higher-order mathematical function and can be graded in two dimensions if desired. For example, if the desired taper is circular in shape, the pattern can be graded in both radial and angular dimensions.

Preferably a conventional advanced computer graphics software package, such as MATHEMATICA™ symbolic algebra and graphics package, capable of generating mathematically sophisticated two-dimensional density plots, may be employed to create the dot pattern corresponding to the desired resistive taper.

As shown and preferred in FIG. 1, a phototool, which is an image bearing medium for use in photochemical etching, is preferably fabricated with the black portions of the graded pattern corresponding to the opaque portions of the phototool and the white portions of the graded pattern corresponding to the transparent portions of the phototool. During the subsequent preferred photochemical etching process the phototool preferably permits light to pass through the transparent regions and polymerize a photosensitive resist applied to the metal coating corresponding to the graded pattern on the phototool.

Preferably the phototools employed in the preferred method of the present invention can be manufactured in two types, namely positive and negative. A positive phototool reproduces the negative of the image as it appears on the phototool when using a negative photoresist. A negative phototool will reproduce a positive image of the pattern when processed. The preferred choice of using both positive and negative phototools and photoresist provides for considerable flexibility.

The phototool can preferably be created using two methods. For example, the phototool can preferably be created by using the printer to print the optically graded pattern onto a transparent sheet of material such as MYLAR™ polymetric films. Alternatively, the phototool can preferably be produced by conventional photographic means. Using the photographic technique, the preferred optically graded pattern is preferably printed on paper, a camera is used to photograph the optically graded pattern, and then the resultant photograph is printed on a clear medium to produce the preferred phototool. This photographic technique has two distinct advantages over the direct printing method. First, the presently preferred photographic technique provides for phototools whose size is larger than those created using the direct printing method. Second, the presently preferred photographic technique provides a phototool with a greater resolution when compared to phototools produced directly from a printer. Using this preferred photographic technique, the paper printout may preferably be scaled such that the final image is a multiple of the original. When using either method, however, the presently preferred computer-controlled optically graded pattern is preferably printed using, by way of example, a high density, PostScript compatible laser printer with a print density of at least 1,270 dots per inch (dpi), such as a commercially available Linotype Linotronic L100 printer by way of example.

As further shown and preferred in FIG. 1, the presently preferred phototool is preferably used to photochemically etch the graded pattern, such as preferably into a kiloangstrom-thick conductive coating upon a mil-thick substrate of polyimide or other insulating material. The preferred insulating substrate and preferred conductive coating are dependent on the given application. Different conductive coatings placed upon various insulating substrates result in different minimum and maximum resistivities of the resultant resistive taper. The minimum resistivity of a given insulating substrate covered by a conductive coating is known and specified. For example, Altair-M from Southwall Corp. is rated at 5 ohms/square and 60 ohms/square. The maximum resistivity is preferably the resistivity at which the conductive and transition regions meet and must be determined empirically, as shown in the example below. The substrate used may preferably be, by way of example, copper-coated KAPTON™ polymetric films, ALTAIR-M™ metallized substrate or another insulating substrate covered by another thin conductive coating whose minimum and maximum resistivities meet desired design requirements. As is well known, photochemical etching, in which the presently preferred phototool is preferably used to photochemically etch the graded pattern, is normally a multi-step process.

In accordance with the preferred method of the present invention, an insulating material coated with a conductive material is preferably cleaned and coated with a unpolymerized photosensitive resist. The photosensitive resist can preferably be conventionally applied by immersion, spray painting or by a film lamination procedure. This photosensitive resist can be positive or negative. The preferred phototool is then preferably placed over the photosensitive resist-coated substrate and passed through an exposure unit. The exposure unit, used in combination with the preferred phototool, preferably conventionally provides ultraviolet light which polymerizes the resist onto portions of the combined material. The purpose of the preferred phototool in the present invention is to prevent the ultraviolet light from reaching and polymerizing particular portions of the substrate. When using a negative photosensitive resist, the metal coating applied to the insulating material will remain beneath the transparent regions of the phototool whereas when using a positive photosensitive resist, the metal coating applied to the insulating material will remain beneath the opaque regions of the phototool.

The portions of the photosensitive resist which have not been exposed to ultraviolet light are then preferably conventionally dissolved and washed away by immersion in a dilute, slightly alkaline solution, typically sodium carbonate. After the unexposed portions of the photosensitive resist have been dissolved, the substrate remains coated with the portions of the photosensitive resist which have been polymerized. This polymerized photosensitive resist protects the underlying conductive material from the forthcoming etchant, which preferably dissolves all of the conductive material uncovered by the unpolymerized resist.

The substrate is then preferably sprayed with or immersed in a solution which will conventionally dissolve the conductive material unprotected by the polymerized photosensitive resist. Various conventional chemical solutions are available for use in this stage of the process. A typical such solution used is an acidic solution of ferric chloride.

Preferably, after this has been accomplished the polymerized photosensitive resist which protected portions of the conductive coating is removed using a typical conventional solution, such as a moderately alkaline solution of potassium hydroxide.

Preferably, the above-defined method is iteratively performed for each particular substrate and conductive coating used. By way of example, it is desired to create a resistive taper that has a linear taper in surface resistivity in one dimension. The substrate used in this example is 2 mil KAPTON™ polymetric film coated with 9000 angstroms of copper. In accordance with the present invention, as previously noted, initially a graded pattern ranging linearly in optical density from pure black to pure white with a specific dot density, D, equal to ten (10) dots per inch, and print angle A, equal to zero (0) degrees, is preferably prepared using a conventional computer graphics software package, such as MATHEMATICA™ Symbolic algebra and graphics package. The following is an example of a typical MATHEMATICA™ Symbolic algebra and graphics package software code which may be used to create this preferred optically graded pattern:

```
Plot3D[ {0, GrayLevel[1 − x]},
        {x, 0.0, 1.0}, {y, 0.0, 1.0},
        Mesh → False
        Viewpoint → {0, 0, 2},
        Plotpoints → 91,
        BoxRatios → {1, 4, 0},
        Axes → None,
        Boxed → False].
```

The dot density D and the print angle A are preferably specified using MATHEMATICA™ Symbolic algebra and graphics package "Display" function independent of the foregoing code section. In the above example code, a pure black gray level is represented by GrayLevel[0.0] and a pure white gray level is represented by GrayLevel[1.0].

As also noted above, this optically graded pattern is then preferably used to create a desired phototool using either of the above-defined processes: either by printing the pattern directly onto a transparent film or by printing the pattern onto paper and using the photographic means to produce the phototool, with the phototool then being used to photochemically etch the graded pattern onto the conductive layer of the given substrate. In this example, a 24 inch by 6 inch resistive taper with the linear optical grade oriented in the 24-inch direction (defined as the x-direction) is preferably created. The resultant taper is then preferably measured to determine how the surface resistivity (defined in units of ohms/square) of the device varies along a particular dimension of the taper (in this example, the 24-inch direction). The resistive, transition and conductive regions of the taper are then preferably located. A regression model of resistivity in the conductive region against distance is then preferably plotted. In the present example, the surface resistivity plot in the 24-inch direction in the conductive region, with GL defined as the gray level and R defined as the surface resistivity is:

| GL    | R (ohms/square) |
|-------|-----------------|
| 2/24  | 3               |
| 3/24  | 4               |
| 4/24  | 5               |
| 5/24  | 7               |
| 6/24  | 9               |
| 7/24  | 12              |
| 8/24  | 17              |
| 9/24  | 20              |
| 10/24 | 28              |
| 11/24 | 35              |
| 12/24 | 50.             |

In the conductive region, a curve fit relating resistivity (ohms/square) to x (unitless) is then preferably performed, with the result of this curve fit being the function R(x)=f(x) =1.7094exp(6.6867x). In the present example, the optical grade was defined as linear and was oriented in the x-direction and, thus, GL=x and, therefore, f(x)=1.7094exp (6.6867 GL).

A mathematical function, h(x) is preferably derived such that R(x)=h(x), which corresponds to the desired taper of surface resistivity in the x-direction. Since the grade of resistivity of the desired taper is linear, the function h(x) can preferably be represented as h(x)=ax+b. This equation can then preferably be solved for variables a and b by preferably choosing one data point near the intersection of the transition and conductive regions (12/24, 50) and a second data point near the location of maximum conductivity (2/24, 3). Preferably, the two equations, (1) 50=(12/24)a+b and (2) 3=(2/24)a+b can then be solved simultaneously with the result that a=112.8 and b=−6.4, and thus, h(x)=112.8x−6.4.

The equation f(x)=h(x) is then preferably solved for x as follows:

$$1.7094exp(6.6867\ GL)=112.8x-6.4$$

$$exp(6.6867\ GL)=(112.8x-6.4)/1.7094$$

$$6.6867\ GL=ln((112.8x-6.4)/1.7094)$$

$$GL=(ln((112.8x-6.4)/1.7094))/6.6867$$

This function preferably provides the gray level, GL, required as a function of x in the conductive region necessary to create a resistive taper with the characteristic that the resistive taper preferably varies in the x-direction according to the function R(x)=112.8x−6.4. This derived function is then preferably used with the above graphics software package, MATHEMATICA™ Symbolic algebra and graphic package, along with the previously defined D, A, and PlotPoint values to create a revised optically graded pattern corresponding to the desired resistive taper. The following is an example of a typical MATHEMATICA™ Symbolic algebra and graphics package software code which may be used to create the revised optically graded pattern, again with dot density, D, set to 10 dots per inch and print angle, A, set to zero degrees:

```
Plot3D[{0, GrayLevel[1−(Log[(112.8 x −
             6.4)/1.7094])/6.6867]},
        {x, 0.0, 1.0}, {y, 0.0, 1.0},
        Mesh → False,
        ViewPoint → {0, 0, 2},
        PlotPoints → 91,
        BoxRatios → {1, 4, 0},
        Axes → None,
        Boxed → False].
```

The above mentioned steps of creating the phototool and using the phototool to photochemically etch the given substrate are then preferably repeated to produce the resistive taper.

By controlling the type of grade in the initial pattern in accordance with the presently preferred method of the present invention, the surface resistivity of the resultant resistive taper can be controlled. With the use of a computer in the above method, virtually any optically graded pattern can be created thereby leading to any corresponding resistive taper. Examples of grades in resistivity which can be created using the presently preferred method of the present invention include exponential, hyperbolic cosine, cosine squared, Weber function, rectified sine and innumerable other specifically tailored grades.

The previously described method of the present invention has many advantages. The method allows for enhanced control over the resulting resistive taper at relatively low cost. The method is robust, allowing the production of high-quality resistive tapers repeatedly. Additionally, the method provides for a taper based on any continuous mathematical function.

Although the present invention has been described in considerable detail with reference to certain preferred versions thereof, other versions are possible without departing from the spirit and scope of the present invention. Therefore, the spirit and scope of the appended claims should not be limited to the description of the preferred versions contained therein.

What is claimed is:

1. A method for producing a desired resistive taper under computer control for controlling surface resistivity comprising the steps of:

correlating along a function defining said desired resistive taper the magnitudes of surface resistivity to magnitudes representing optical gray levels to be outputted by said computer;

creating a computer-controlled optically graded pattern of said optical group levels on an phototool corresponding to said desired resistive taper; and photochemically etching said computer-controlled optically graded pattern onto an insulating substrate having a conductive coating using said phototool.

2. The method of claim 1 wherein said phototool producing step comprises the step of printing said computer-controlled optically graded pattern onto a surface.

3. The method of claim 1 wherein said phototool producing step comprises the step of printing said computer-controlled optically graded pattern onto a transparent film surface.

4. The method of claim 1 wherein said phototool producing step comprises the step of producing said phototool by photographic means.

5. The method of claim 1 wherein said phototool producing step comprises the step of printing said computer-controlled optically graded pattern onto a sheet of paper, photographing said sheet of paper, and printing said photograph onto a transparent film surface.

6. The method of claim 1 further comprising the step of enlarging said computer-controlled optically graded pattern using photographic means prior to producing said phototool, said phototool producing step comprising the step of producing said phototool from said enlarged computer-controlled optically graded pattern.

7. The method of claim 1 wherein said photochemical etching step comprises the step of photochemically etching said computer-controlled optically graded pattern into a conductive layer deposited onto an insulating material.

8. The method of claim 1 wherein said substrate comprises copper-coated polymeric film.

9. A resistive taper produced by the method of claim 1 wherein said function defining said desired taper is selected from the group consisting of linear, exponential, hyperbolic cosine, cosine squared, Weber function, or rectified sine wave, and said conductive coating has a pattern corresponding to said optical gray levels of said graded pattern thereby creating said desired taper.

10. The method of claim 1 wherein the insulating substrate and the conductive coating substantially determine the surface resistivity.

11. A resistive taper produced by the method of claim 10 wherein said function defining said desired taper is selected from the group consisting of linear, exponential, hyperbolic cosine, cosine squared, Weber function, or rectified sine wave, and said conductive coating has a pattern corresponding to said optical gray levels of said graded pattern thereby creating said desired taper.

* * * * *

UNITED STATES PATENT AND TRADEMARK OFFICE
CERTIFICATE OF CORRECTION

PATENT NO. : 5,712,613
DATED : January 27, 1998
INVENTOR(S) : BUCKNER, et al.

It is certified that error appears in the above-identified patent and that said Letters Patent is hereby corrected as shown below:

Col. 7, line 11:

said optical "group" -- gray -- levels on "an" -- a -- phototool corresponding

Signed and Sealed this

Fourteenth Day of April, 1998

Attest:

BRUCE LEHMAN

Attesting Officer

Commissioner of Patents and Trademarks